US008760586B2

(12) United States Patent
Imai et al.

(10) Patent No.: US 8,760,586 B2
(45) Date of Patent: Jun. 24, 2014

(54) TUNER MODULE AND A RECEIVING APPARATUS

(75) Inventors: Tadashi Imai, Chiba (JP); Teruyuki Toyoda, Tokyo (JP)

(73) Assignee: Sony Corporation, Tokyo (JP)

( * ) Notice: Subject to any disclaimer, the term of this patent is extended or adjusted under 35 U.S.C. 154(b) by 18 days.

(21) Appl. No.: 13/518,327

(22) PCT Filed: Dec. 21, 2010

(86) PCT No.: PCT/JP2010/072990
§ 371 (c)(1),
(2), (4) Date: Jun. 21, 2012

(87) PCT Pub. No.: WO2011/081058
PCT Pub. Date: Jul. 7, 2011

(65) Prior Publication Data
US 2012/0264384 A1  Oct. 18, 2012

(30) Foreign Application Priority Data

Dec. 28, 2009  (JP) ................................ 2009-298314

(51) Int. Cl.
*H04N 5/50* (2006.01)
(52) U.S. Cl.
USPC ........................................... 348/731; 334/85
(58) Field of Classification Search
USPC ............. 334/85; 361/801, 816; 348/725, 731; 455/150.1
See application file for complete search history.

(56) References Cited

U.S. PATENT DOCUMENTS

| 6,011,700 | A  | * | 1/2000 | Matsuzaki | ..................... 361/816 |
| 6,388,892 | B1 | * | 5/2002 | Maeda | ........................ 361/801 |
| 6,404,309 | B1 | * | 6/2002 | Hall et al. | .................... 334/85 |
| 7,616,081 | B2 | * | 11/2009 | Inaba et al. | .................... 334/85 |
| 7,764,513 | B2 | * | 7/2010 | Miyamoto et al. | ........... 361/816 |
| 2006/0202698 | A1 | * | 9/2006 | Fujiwara | ..................... 324/337 |

FOREIGN PATENT DOCUMENTS

| JP | 11-341374 | 12/1999 |
| JP | 2001-136464 | 5/2001 |
| JP | 2001-177424 | 6/2001 |
| JP | 2003-143024 | 5/2003 |
| JP | 2003-309477 | 10/2003 |

* cited by examiner

*Primary Examiner* — Sonny Trinh
(74) *Attorney, Agent, or Firm* — K&L Gates LLP

(57) ABSTRACT

Provided are a tuner module and a receiving apparatus capable of providing great degrees of variation and freedom to a layout in a main board, improving a degree of freedom of design, and achieving low cost. A tuner module includes a tuner module board on which a tuner functional unit is formed, a main board on which the tuner module board is surface-mounted, and a shield casing including at least one antenna connector, arranged to cover the surface-mounted tuner module board, and fixed to the main board. In the shield casing, a length of a longest long-side is a length equal to or less than ¼ of a wavelength of a highest received frequency in the air.

7 Claims, 5 Drawing Sheets

PHOTOGRAPH OF CUT PIECE AND END SURFACE THROUGH-HOLE PART FROM DIRECTION INDICATED BY ARROW

TUNER MODULE AND A RECEIVING APPARATUS

CROSS REFERENCES TO RELATED APPLICATIONS

The present application is a national stage of International Application No. PCT/JP2010/072990 filed on Dec. 21, 2010 and claims priority to Japanese Patent Application No. 2009-298314 filed on Dec. 28, 2009, the disclosure of which is incorporated herein by reference.

BACKGROUND

The present invention relates to a tuner module and a receiving apparatus capable of being applied to, for example, a television tuner.

In recent years, television (TV) tuners, which are an example of a high-frequency module, have been embedded in IT devices such as personal computers (PCs) as well as TV receivers.

For example, a first example of a shape of a TV tuner and a method of mounting the TV tuner is disclosed in Patent Literature 1 and a second example thereof is disclosed in Patent Literature 2.

In the first example, in a tuner, a circuit board having electronic parts mounted thereon is embedded in a metal shield housing, and a connector for a connection of a cable from an antenna is fixed to the shield housing. In the tuner, terminals are mounted on the circuit board in the shield casing, drawn toward the outside of the shield housing, and connected and fixed to a mounting board.

In this shape, in a design for an assembly with the outside of the housing, parts connected to the outside, such as the shape of the tuner, an arrangement of the terminals, and a position of the antenna connector, are fixed.

This shape is a shape of a tuner used for a general TV.

In the second example, a part of a shield cover covering a thin board for a tuner is coupled with an engagement hole provided in a main board (mounting board) on which a tuner module is mounted.

Accordingly, a shield housing having a 3-piece configuration as in the first example is unnecessary, the tuner can be mounted on the main board using a simple method, and noise entering from the outside can be eliminated using a low cost method.

CITATION LIST

Patent Literature

Patent Literature 1: Japanese Patent Application Laid-Open No. 2003-309477

Patent Literature 2: Japanese Patent Application Laid-Open No. 2003-143024

SUMMARY

Technical Problem

However, in the first example described above, when the position of the antenna connector is changed without changing a basic internal circuit on a design of an entire TV or when it is necessary to change positions of contact terminals or an arrangement number, the tuner is often re-designed as a similar but different tuner.

That is, it is necessary to change or newly create a mold for a press process used to make the shield housing or to change adjustment equipment according to the terminal arrangement.

Thus, in the shape of the tuner of the first example, a degree of freedom of a mechanism design is low, many types of models with a small change as in the example are created, and much design effort is consumed.

However, in the second example, the antenna connector shown in the first example is not included.

That is, parts related to an internal tuner circuit and an internal module board covered with the shield housing are less susceptible to a noise, but since there is no description of the antenna connector part, a shape of the connector is unclear.

In general, in an F or IEC type plug used for an antenna connector of a TV tuner, a core is not covered with a shield cover or a coating except in special cases, and is fixed to the casing and used as in the first example.

In this case, even when the core is not coated with a particular coating, there is no problem since the core is covered with the shield casing together with a circuit board inside the tuner.

However, in the second example, there is no connector mounting structure and no electrical resistance against entering noise is known.

In this case, a connection is made using a coated cable including the antenna connector, but it takes much time to make the antenna connector with the coated cable. In most cases, the antenna connector with the coated cable is manually made and becomes very expensive.

As described above, in the TV tuner structure using a related art, there remain disadvantages such as great limitation of an actual use state as well as the shape of the tuner, and high cost necessary for a mounting shape of the antenna connector even when the structure is small and thin.

The present invention provides a tuner module and a receiving apparatus capable of providing great degrees of variation and freedom to a layout in a main board, improving a degree of freedom of design, and achieving low cost.

Solution to Problem

According to a first aspect of the present invention, there is provided a tuner module including: a tuner module board on which a tuner functional unit is formed; a main board on which the tuner module board is surface-mounted; and a shield casing including at least one antenna connector, arranged to cover the surface-mounted tuner module board, and fixed to the main board.

Preferably in the shield casing, a length of a longest long-side is a length equal to or less than ¼ of a wavelength of a highest received frequency in the air.

Preferably in the inside of the shield casing, a partition area having a plurality of partitions formed by inner walls is formed, and a length of a long side of a longest inner wall is a length equal to or less than ¼ of a wavelength of the highest received frequency in the air.

Preferably in the antenna connector, a length of an exposed core is a length equal to or less than ¼ of a wavelength of a highest received frequency in the air.

According to a second aspect of the present invention, there is provided a receiving apparatus including: an antenna connector connected to an antenna that receives a broadcast wave signal; a tuner module including a frequency conversion function for the broadcast wave signal received via the antenna connector; and a demodulation unit for demodulating the frequency-converted broadcast wave signal, wherein the tuner module includes: a tuner module board on which a tuner functional unit including the frequency conversion function is formed; a main board on which the tuner module board is surface-mounted; and a shield casing including at least one antenna connector, arranged to cover the surface-mounted tuner module board, and fixed to the main board.

Advantageous Effects of Invention

According to the present invention, it is possible to provide great degrees of variation and freedom to a layout in a main board, improve a degree of freedom of design, and achieve low cost.

Additional features and advantages are described herein, and will be apparent from the following Detailed Description and the figures.

DETAILED DESCRIPTION

Hereinafter, embodiments of the present invention will be described with reference to the accompanying drawings.

Further, a description will be given in the following order.
1. First embodiment (first configuration example of tuner module)
2. Second embodiment (second configuration example of tuner module)
3. Third embodiment (third configuration example of tuner module)
4. Fourth embodiment (configuration example of receiving apparatus)

1. First Embodiment

Figure 1:
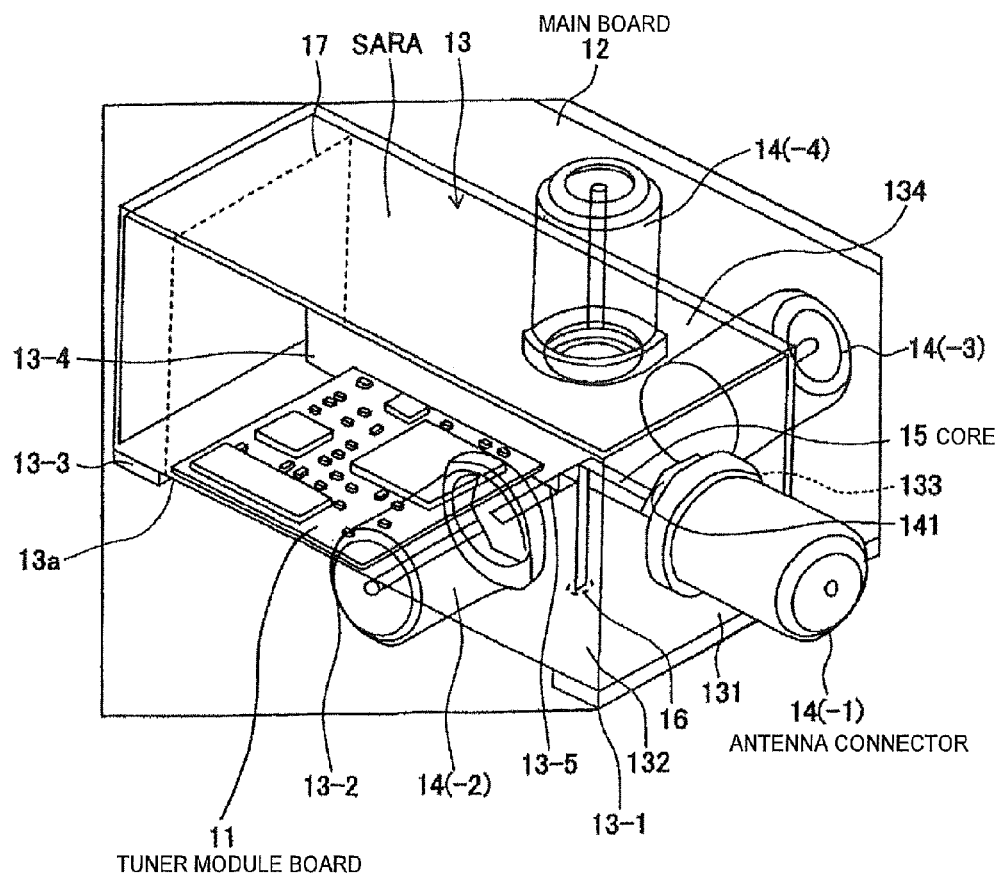
FIG. 1 is a view showing a configuration example of a tuner module according to a first embodiment of the present invention.

FIG. 1 is a view showing a configuration example of a tuner module according to a first embodiment of the present invention.

A tuner module 10 according to the first embodiment includes a tuner module board 11, a main board 12, a shield casing 13, and an antenna connector 14 (-1 to -4).

In the tuner module board 11, for example, a circuit is formed as a functional unit of a television (TV) tuner module.

This tuner module board 11 is surface-mounted on the main board 12.

The shield casing 13 is formed in a hollow rectangular parallelepiped shape having an opening 13a formed in one face (bottom).

At least one antenna connector 14 is fixed to the shield casing 13 by mating caulking, and the shield casing 13 is arranged to cover the surface-mounted tuner module board 11 and fixed to the main board 12, for example, by soldering.

For the shield casing 13 of the present embodiment, a metal generally called nickel silver is used, which is a thin material and is an alloy of copper, nickel and zinc having excellent solderability.

However, since there is no problem as long as conductivity is excellent, an inexpensive tin material or something similar may be used as the shield casing 13 if the shape of the shield casing 13 is less limited.

At least one antenna connector 14 is fixed to the shield casing 13 of the present embodiment by mating caulking, as described above.

In the present shield casing 13, antenna connectors 14-1 to 14-4 may be fixed to side faces 131, 132 and 133 at end sides and an upper face 134 in a fixed state through a caulking process.

The antenna connector 14 of FIG. 1 has a caulking part 141 folded toward the inside of the shield casing 13. The antenna connector 14 is fixed in such a manner that a metal plate constituting the shield casing 13 is sandwiched between this caulking part 141 and a part of the antenna connector 14 outside the shield casing 13.

This method is called a caulking process and is used similarly in other embodiments.

The core 15 of the antenna connector 14 is a signal input terminal in a hole 16 positioned with the tuner module board 11 on the main board 12, and is electrically connected to the tuner module board 11 by a pattern on the main board 12.

Further, in the example of FIG. 1, a state in which the antenna connectors 14-2 to 14-4 are fixed to the shield casing 13 by the same mating caulking is depicted.

Although not shown, the antenna connectors 14-2, 14-3 and 14-4 have the same core as the core 15 of the antenna connector 14-1, and are aligned with the same lines lengths.

In the present embodiment, although this will be described later, a length of the longest long-side of the shield casing 13 is set to be equal to or less than ¼ of a wavelength of a highest received frequency in the air.

Further, in the inside of the shield casing 13, a partition area having a plurality of partitions formed by inner walls is formed, and a length of a long side of the longest inner wall is set to a length equal to or less than ¼ of a wavelength of the highest received frequency in the air.

Further, in the antenna connector 14, a length of an exposed part of the core 15 is set to a length equal to or less than ¼ of a wavelength of the highest received frequency in the air.

The tuner module 10 has a structure in which a high-frequency connection is made between the core 15, which is an input signal supply point of the antenna connector 14, and the circuit, which is a functional unit of the tuner, by wirings on the main board 12.

The core 15 of the antenna connector 14 is connected to the tuner module board 11 through direct contact with the tuner module board 11.

Further, the core 15 of the antenna connector 14 is fixed by directly passing through the tuner functional unit and also passing through the underlying main board 12.

In the present embodiment, as a method of connecting the tuner module board 11 with the main board 12, for example, a solder ball called a Ball Grid Array (hereinafter, BGA) is inserted between the tuner module board 11 and the main board 12 through a reflow process.

Figure 2:
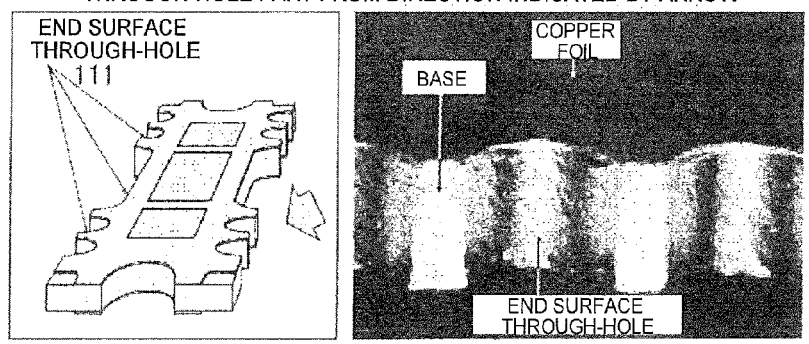
FIG. 2 is an illustrative view of end surface through-holes.

Alternatively, for example, a method of providing through-holes 111 in ends (end surfaces) of the board as shown in FIG. 2 and connecting the tuner module board 11 and the main board 12 by soldering in the through-holes using only the end surface of half of a cylinder of the through-hole through router cut after plating is used for fixing.

Next, a definition of a length of the core 15 of the antenna connector 14 in the present embodiment will be described.

Figure 3:
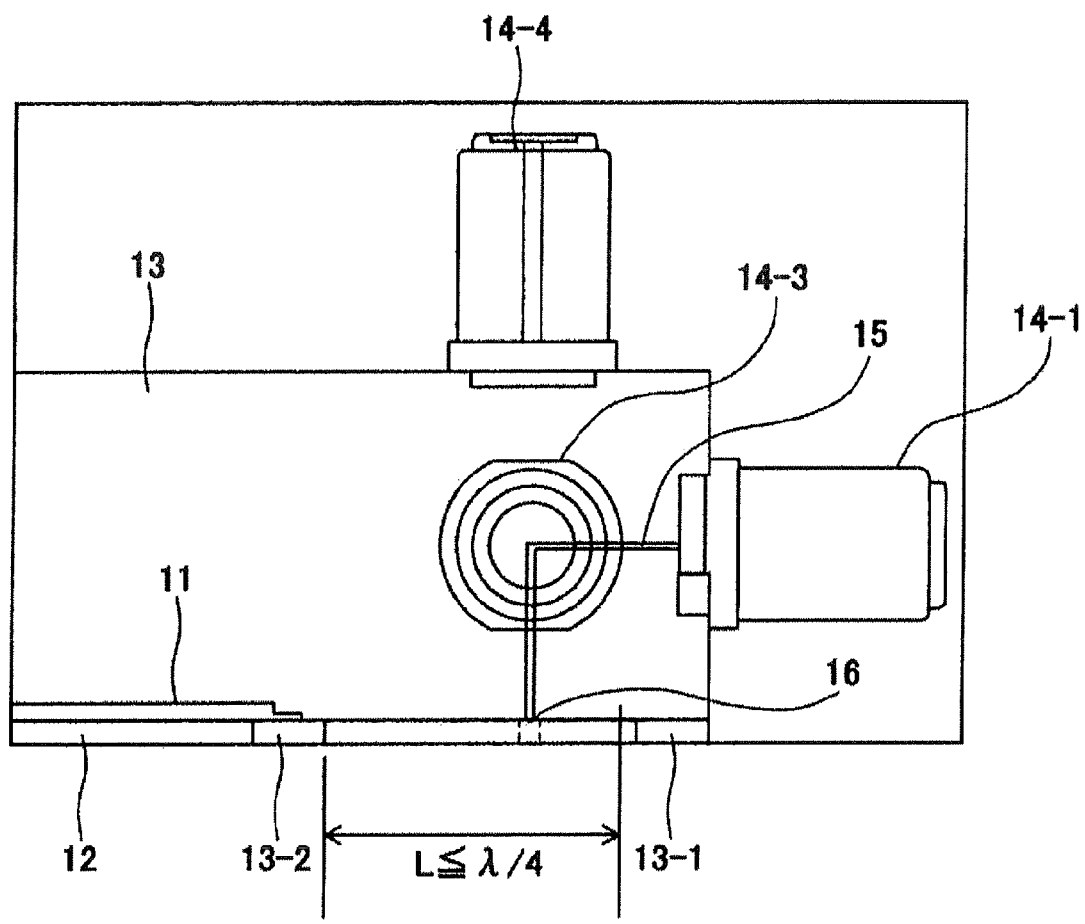
FIG. 3 is an illustrative view defining a length of a core of an antenna connector in the present embodiment.

FIG. 3 is an illustrative view defining a length of the core of the antenna connector in the present embodiment.

Since high frequency inductances of the core portions of the antenna connectors 14-1 to 14-4 made as described above are substantially the same, high frequency impedance can be the same irrespective of a mounting direction.

Accordingly, in the TV tuner module 10 having the present structure, re-design of an electrical characteristic due to a mounting direction of the antenna connector 14 can be omitted, and a TV tuner module having a mounting structure subjected to variations can be provided in a short design time.

In addition, in the antenna connector 14 (-1 to -4), the length of the exposed part of the core 15 is set to a length equal to or less than ¼ of a wavelength of the highest received frequency in the air.

Further, protrusions 13-1, 13-2, 13-3, 13-4, and 13-5 of the shield casing 13 shown in FIG. 1 are solder parts for connection to the main board 12, mainly, through a solder joint.

Further, intervals of the soldering protrusion 13-1, 13-2, 13-3, 13-4, 13-5 will be described with reference to FIG. 3.

For the shield casing 13 to have a good shield effect, even when a received frequency of the TV tuner module 10 is an upper limit, a noise is prevented from entering from the interval of the protrusions into the shield and a received signal is prevented from leaking from the internal tuner circuit.

Here, the reception frequency of the TV tuner module 10 being the upper limit refers to an upper limit reception frequency at the shortest wavelength when a radio wave is induced.

Accordingly, among the solder joint protrusions of the shield casing 13, for example, the interval between the protrusions 13-1 and 13-2 is shorter than ¼ of a wavelength λ of the upper limit reception frequency such that a non-soldering part length L generated when solder-jointed to the main board 12 is set as in the following equation.

λ/4 indicates a wavelength at which the strongest resonance occurs by way of the antenna in the air, and prevents a void, a pattern or the like in which resonance easily occurs from being formed in the high-frequency module, such as the TV tuner module 10.

It is preferable that sense of the solder joint protrusions satisfy a condition of the following equation:

$$L \leq \lambda/4 \qquad \text{[Math. 1]}$$

Specifically, when 2 GHz signal reception is considered, the following is obtained and L is an interval equal to or less than 3.75 cm.

f=2 GHz $$\lambda = C/f = 300,000,000/2,000,000,000 = 0.15 \text{ m} = 15 \text{ cm} \qquad \text{[Math. 2]}$$

where C (speed of light)=300,000,000 m

As is evident from the above description, in the shield casing of the present invention, it is possible to obtain a better shield effect by providing the solder joint parts with the interval or one smaller.

Further, since the resonance occurs in the opening 13a of the shield casing 13, it is preferable that a dimension of the long side of the shield casing 13 also satisfy the above wavelength condition at the received frequency.

When the entire shape of the shield casing 13 is larger than the value of the wavelength condition, it is effective for a partition area SARA to be formed by providing a partition 17 therein to satisfy the wavelength condition, as indicated by a dotted line in FIG. 1.

In the present example, while the cores 15 of all the antenna connectors 14 are L-shaped, the cores 15 may be U-shaped arcs or a method of shortening the core length by forming a plurality of bends in a shape such as a part of a polygon may be used.

It is possible to avoid unnecessary resonance by making the length of the core shorter than the above resonance wavelength.

2. Second Embodiment

Figure 4:
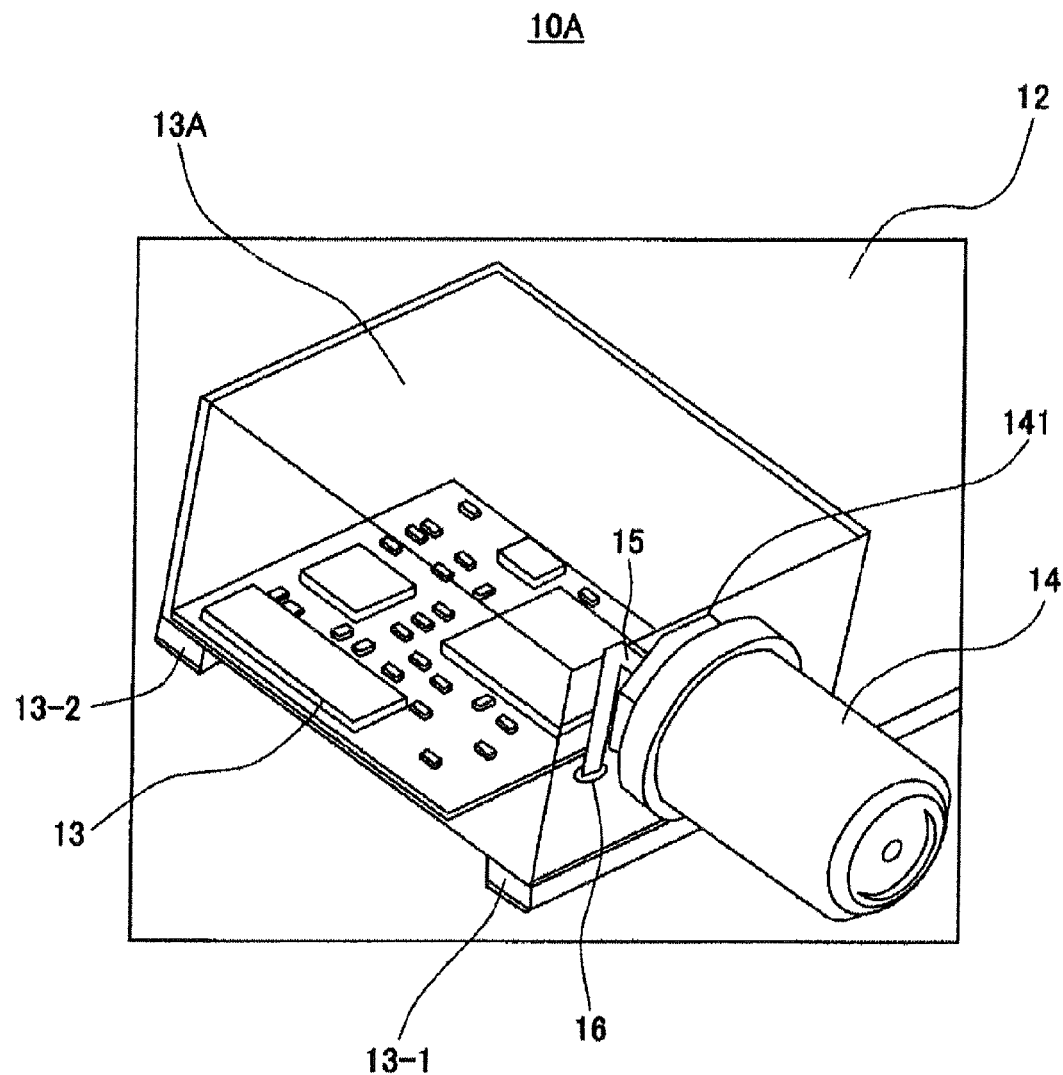
FIG. 4 is a view showing a configuration example of a tuner module according to a second embodiment of the present invention.

FIG. 4 is a view showing a configuration example of a tuner module according to a second embodiment of the present invention.

The tuner module 10A according to the second embodiment differs from the tuner module 10 according to the first embodiment in that a shield casing 13A is small.

That is, the tuner module 10A according to the second embodiment is an example in which the tuner module 10A is small. The same reference numerals are given to parts already described in the first embodiment.

In this case, since a total length of a core 15 of an antenna connector 14 can be shortened, a high frequency inductance value that is proportional to the length of the core 15 can decrease.

In general, since impedance of the inductance component increases in proportion to a high frequency, loss in the high frequency increases as the total length of the core 15 is shorter.

In the present example, it is possible to prevent deterioration of reception sensitivity in a higher frequency since the inductance of the core 15 can decrease.

The antenna connector 14 of FIG. 4 includes a caulking part 141 folded toward the inside of the shield casing 13A, similar to FIG. 1. The antenna connector 14 is fixed in such a manner that a metal plate constituting the shield casing 13A is sandwiched between this caulking part 141 and a part of the antenna connector 14 outside the shield casing 13A.

3. Third Embodiment

Figure 5:
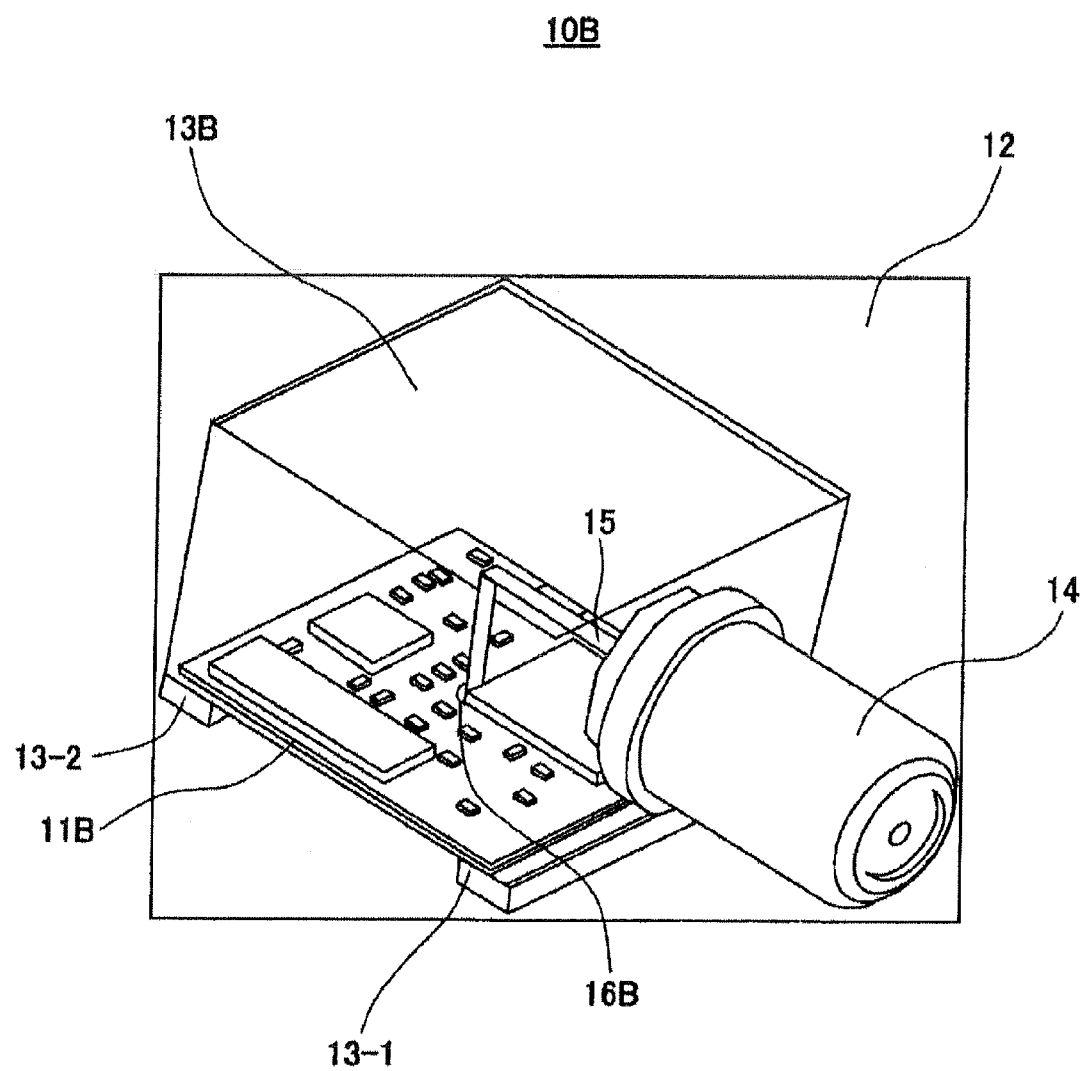
FIG. 5 is a view showing a configuration example of a tuner module according to a third embodiment of the present invention.

FIG. 5 is a view showing a configuration example of a tuner module according to a third embodiment of the present invention.

A tuner module 10B according to the third embodiment differs from the tuner module 10A according to the second embodiment in that a core 15 of an antenna connector 14 is arranged to be directly connected in a hole 16B provided in a tuner module board 11.

Accordingly, a smaller shield casing can be used.

It is understood that even in the present example, the antenna connector 14 can be mounted in another face of the shield casing 13B, as shown in FIG. 1.

In addition, a great degree of freedom can be given in an arrangement of the tuner module board 11B on the main board 12, and a mechanistic design of a TV set or a video recorder is facilitated.

In the present configuration, it is possible to use a method of fixing the core 15 of the antenna connector 14 to a copper foil part of the tuner module board 11B through soldering.

Alternatively, a structure in which a through-hole is provided in the tuner module board 11B and a concentric hole is provided in the main board 12 so that the core 15 of the antenna connector 14 can be brought into reliable contact with the tuner module board 11B may be employed.

In this case, the hole of the main board 12 may not be connected anywhere and it is not important whether or not the hole is connected with the core 15 of the antenna connector 14.

As described above, according to the tuner module of the present embodiment, terminals for connecting the tuner module with the main board can be removed and cost can be reduced.

Since a TV tuner module having mounting positions for at least four antenna connectors can be provided, it is possible to provide great degrees of variation and freedom to a layout on the main board.

As a result, in related art, it is necessary to design a number of derivative models in order to realize structural variations, which requires very much effort. However, according to the present embodiment, it is possible to use a common module board.

In addition, it is possible to shorten a design period of time since it is possible to cope with a plurality of destination ports with a single configuration.

The present invention may also be applied in a configuration example in which the tuner module of the present configuration is directly mounted on the main board and the tuner module board is removed.

A tuner module having such a configuration may be applied to a receiving apparatus such as a TV receiver.

4. Fourth Embodiment

Figure 6:
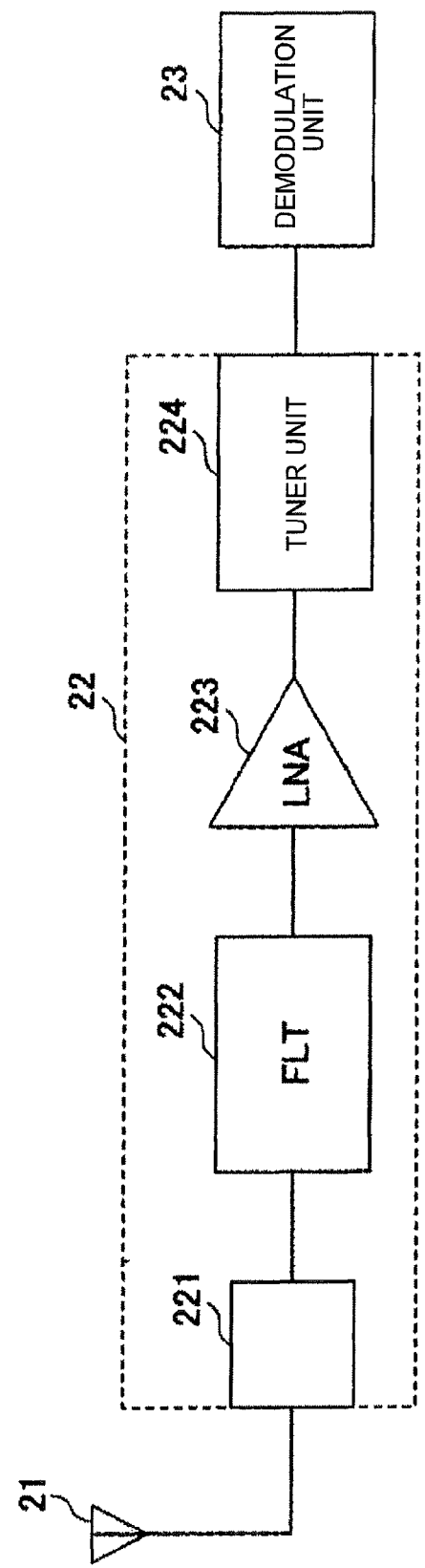
FIG. 6 is a diagram showing a configuration example of a receiving apparatus that employs the tuner module according to the present embodiment.

FIG. 6 is a diagram showing a configuration example of a receiving apparatus that employs the tuner module according to the present embodiment.

This receiving apparatus 20 is configured to be capable of receiving, for example, a terrestrial broadcast wave signal or a satellite broadcast wave signal.

The receiving apparatus 20 includes a receiving antenna 21 for receiving the broadcast wave signal, a tuner module 22 including a frequency conversion function, and a demodulation unit 23, as shown in FIG. 6.

The tuner modules 10, 10A and 10B according to the first to third embodiments described above may be employed as the tuner module 22.

The tuner module 22 includes an antenna connector 221 corresponding to the antenna connector 14 of the tuner module 10, 10A or 10B, a filter (FLT) 222, a low noise amplifier (LNA) 223, and a tuner unit 224.

A high pass filter (HPF), a band pass filter (BPF) or a low pass filter (LPF) is appropriately applied as the filter 222 according to a broadcast wave that is received.

The LNA 223 amplifies the broadcast wave signal passing through the filter 222 and supplies the amplified broadcast wave signal to the tuner unit 224.

When the received signal is the satellite broadcast wave signal, the tuner 224 unit frequency-converts the signal to a baseband signal and outputs the baseband signal to the demodulation unit 23. When the received signal is the terrestrial broadcast wave signal, the tuner unit 224 frequency-converts the signal to an intermediate frequency signal and outputs the intermediate frequency signal to the demodulation unit 23.

When the received signal is the satellite broadcast wave signal, the demodulation unit 23 demodulates a video signal and an audio signal of the baseband signal to generate a transport stream.

When the received signal is the digital terrestrial broadcast wave signal, the demodulation unit demodulates a video signal and an audio signal of the intermediate frequency signal to generate a transport stream.

When the received signal is an analog terrestrial broadcast wave signal, the demodulation unit demodulates a video signal and an audio signal of an intermediate frequency signal to generate an analog video signal and an analog audio signal.

According to the present receiving apparatus, it is possible to provide great degrees of variation and freedom to a layout in the main board, improve a degree of freedom of design, and achieve low cost since the tuner modules 10, 10A and 10B according to the first and third embodiments are employed.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

10, 10A, 10B Tuner module
11, 11B Tuner module board
12 Main board
13, 13A, 13B Shield casing
14 (-1 to -4) Antenna connector
15 Core
16, 16B Hole
17 Partition
SARA Partition area
20 Receiving apparatus
21 Receiving antenna
22 Tuner module
23 Demodulation unit

The invention claimed is:

1. A tuner module comprising:
a tuner module board on which a tuner functional unit is formed;
a main board on which the tuner module board is surface-mounted; and
a shield casing including at least one antenna connector, arranged to cover the surface-mounted tuner module board, and fixed to the main board, wherein, in the shield casing, a length of a longest long-side is a length equal to or less than ¼ of a wavelength of a highest received frequency in the air, and wherein, in the inside of the shield casing, a partition area having a plurality of partitions formed by inner walls is formed, and a length of a long side of a longest inner wall is a length equal to or less than ¼ of a wavelength of the highest received frequency in the air.

2. The tuner module according to claim 1, wherein, in the antenna connector,
a length of an exposed core is a length equal to or less than ¼ of a wavelength of a highest received frequency in the air.

3. The tuner module according to claim 1, wherein a core portion of the antenna connector is connected to the tuner module board through direct contact with the tuner module board.

4. The tuner module according to claim 3, wherein the core portion of the antenna connector is fixed by directly passing through the tuner functional unit and also passing through the underlying main board.

5. A tuner module comprising:

a tuner module board on which a tuner functional unit is formed;

a main board on which the tuner module board is surface-mounted; and a shield casing including at least one antenna connector, arranged to cover the surface-mounted tuner module board, and fixed to the main board, wherein the tuner module has a structure in which a high-frequency connection is made between a core, which is an input signal supply point of the antenna connector, and the tuner functional unit by wirings on the main board.

6. A receiving apparatus comprising:

an antenna connector connected to an antenna that receives a broadcast wave signal;

a tuner module including a frequency conversion function for the broadcast wave signal received via the antenna connector; and a demodulation unit for demodulating the frequency-converted broadcast wave signal, wherein the tuner module includes:

a tuner module board on which a tuner functional unit including the frequency conversion function is formed;

a main board on which the tuner module board is surface-mounted; and a shield casing including at least one antenna connector, arranged to cover the surface-mounted tuner module board, and fixed to the main board, wherein, in the shield casing, a length of a longest long-side is a length equal to or less than ¼ of a wavelength of a highest received frequency in the air, and wherein, in the inside of the shield casing, a partition area having a plurality of partitions formed by inner walls is formed, and a length of a long side of a longest inner wall is a length equal to or less than ¼ of a wavelength of the highest received frequency in the air.

7. A receiving apparatus comprising:

an antenna connector connected to an antenna that receives a broadcast wave signal;

a tuner module including a frequency conversion function for the broadcast wave signal received via the antenna connector; and a demodulation unit for demodulating the frequency-converted broadcast wave signal, wherein the tuner module includes:

a tuner module board on which a tuner functional unit including the frequency conversion function is formed;

a main board on which the tuner module board is surface-mounted; and a shield casing including at least one antenna connector, arranged to cover the surface-mounted tuner module board, and fixed to the main board, wherein, in the antenna connector, a length of an exposed core is a length equal to or less than ¼ of a wavelength of a highest received frequency in the air.

* * * * *